United States Patent
Wu et al.

(10) Patent No.: US 10,748,804 B2
(45) Date of Patent: *Aug. 18, 2020

(54) STRUCTURE WITH MICRO DEVICE HAVING HOLDING STRUCTURE

(71) Applicant: PlayNitride Inc., Hsinchu County (TW)

(72) Inventors: Chih-Ling Wu, Tainan (TW); Yi-Min Su, Tainan (TW); Yu-Yun Lo, Tainan (TW)

(73) Assignee: PlayNitride Inc., Hsinchu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/513,733

(22) Filed: Jul. 17, 2019

(65) Prior Publication Data
US 2019/0363000 A1 Nov. 28, 2019

Related U.S. Application Data

(63) Continuation-in-part of application No. 16/212,697, filed on Dec. 7, 2018, now Pat. No. 10,403,799.
(Continued)

(30) Foreign Application Priority Data

Jun. 5, 2018 (TW) .............................. 107119254 A

(51) Int. Cl.
*H01L 33/44* (2010.01)
*H01L 21/683* (2006.01)
*H01L 33/38* (2010.01)

(52) U.S. Cl.
CPC .......... *H01L 21/6835* (2013.01); *H01L 33/44* (2013.01); *H01L 33/382* (2013.01); *H01L 2221/68368* (2013.01)

(58) Field of Classification Search
None
See application file for complete search history.

(56) References Cited

U.S. PATENT DOCUMENTS 10,403,799 B1 * 9/2019 Wu .................... H01L 33/52
2012/0267661 A1 * 10/2012 Kim .................... H01L 33/486
257/98
(Continued)

FOREIGN PATENT DOCUMENTS

CN 102520832 6/2012
CN 104680939 6/2015
(Continued)

OTHER PUBLICATIONS

Chih-Ling Wu, et al., "Structure With Micro Device," Unpublished U.S. Appl. No. 16/212,690, filed Dec. 7, 2018.
(Continued)

*Primary Examiner* — Bilkis Jahan
(74) *Attorney, Agent, or Firm* — JCIPRNET

(57) ABSTRACT

A structure with micro device including a substrate, at least one micro device and at least one holding structure is provided. The micro device is disposed on the substrate and has a top surface away from the substrate, a bottom surface opposite to the top surface, and a circumferential surface connecting the top surface and the bottom surface. The holding structure is disposed on the substrate. From the cross-sectional view, a thickness of the holding structure is not fixed from the boundary of the top surface and the circumferential surface to the substrate. The micro device is connected to the substrate through the holding structure.

19 Claims, 19 Drawing Sheets

Related U.S. Application Data

(60) Provisional application No. 62/607,325, filed on Dec. 19, 2017.

(56) References Cited

U.S. PATENT DOCUMENTS

| | | | |
|---|---|---|---|
| 2015/0155251 A1* | 6/2015 | Kawakita | H01L 24/32 257/773 |
| 2019/0189495 A1 | 6/2019 | Wu et al. | |
| 2019/0189602 A1 | 6/2019 | Wu et al. | |

FOREIGN PATENT DOCUMENTS

| | | |
|---|---|---|
| CN | 204668356 | 9/2015 |
| CN | 106816408 | 6/2017 |
| TW | 200644265 | 12/2006 |
| TW | 200950159 | 12/2009 |
| TW | I363437 | 5/2012 |
| TW | I455273 | 10/2014 |
| TW | 201620167 | 6/2016 |
| TW | 201701510 | 1/2017 |
| TW | 201705544 | 2/2017 |

OTHER PUBLICATIONS

"Office Action of Taiwan Counterpart Application," with machine English translation thereof, dated Aug. 23, 2019, p. 1-p. 6.

\* cited by examiner

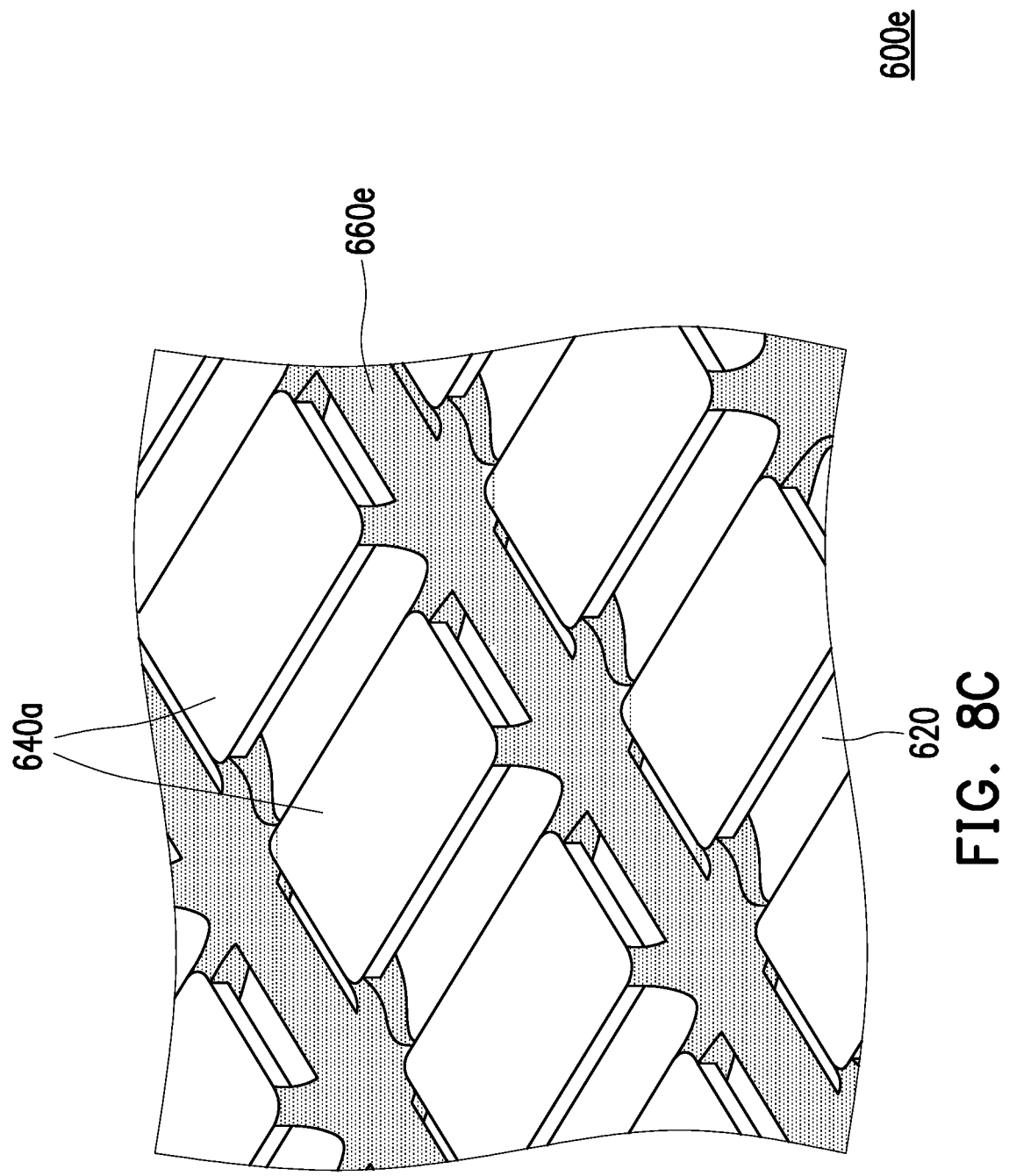

STRUCTURE WITH MICRO DEVICE HAVING HOLDING STRUCTURE

CROSS-REFERENCE TO RELATED APPLICATION

This application is a continuation-in-part application of and claims the priority benefit of U.S. application Ser. No. 16/212,697, filed on Dec. 7, 2018, now allowed, which claims the priority benefits of U.S. provisional application Ser. No. 62/607,325, filed on Dec. 19, 2017, and Taiwan application serial no. 107119254, filed on Jun. 5, 2018. The entirety of each of the above-mentioned patent applications is hereby incorporated by reference herein and made a part of this specification.

BACKGROUND OF THE INVENTION

Field of the Invention

The invention is related to a semiconductor structure, and particularly to a structure with micro device.

Description of Related Art

In current techniques, transfer of micro light emitting diode (LED) is conducted mainly through the means of electrostatic force or magnetic force to transfer the micro LED on a carrier to a receiving substrate. Typically, the micro LED is held through a holding structure such that the micro LED can be picked up more easily from the carrier as well as delivered and transferred to be placed on the receiving substrate; moreover, the quality of the micro LED is not easily affected by other factors through use of the holding structure to hold the micro LED in the transferring process. However, the size and shape of a contact area between the holding structure and the micro LED affect the yield rate of delivery and transfer of the micro LED. In light of the above, it has become an important issue for related industries to find out how to make the holding structure to temporarily hold the micro LED and make the micro LED to be delivered and transferred between the carrier and the receiving substrate more easily and effectively.

SUMMARY OF THE INVENTION

The invention provides a structure with micro device, capable of effectively improving yield rate of delivery and transfer of micro device.

According to the invention, a structure with micro device includes a substrate, at least one micro device and at least one holding structure. The micro device is disposed on the substrate and has a top surface away from the substrate, a bottom surface opposite to the top surface and a peripheral surface connecting the top surface and the bottom surface. The holding structure is disposed on the substrate. From a cross-sectional view, a thickness of the holding structure is not fixed from a boundary between the top surface and the peripheral surface of the micro device to the substrate. The micro device is connected to the substrate through the holding structure.

According to an embodiment of the invention, a horizontal distance between the holding structure and the substrate in a direction parallel to the substrate is gradually increased from the boundary between the top surface and the peripheral surface of the micro device to the substrate.

According to an embodiment of the invention, the holding structure completely exposes the top surface of the micro device.

According to an embodiment of the invention, an upper surface of the holding structure is aligned or slightly lower than the top surface of the micro device.

According to an embodiment of the invention, the upper surface of the holding structure is lower than the top surface of the micro device, there is a gap between the upper surface and the top surface, and a ratio of a vertical distance of the gap to a thickness of the micro device is less than or equal to 0.5.

According to an embodiment of the invention, the holding structure is disposed on the boundary between the top surface and the peripheral surface of the micro device, and located on at least one corner of the peripheral surface.

According to an embodiment of the invention, a ratio of a contact area of the holding structure at the boundary between the top surface and the peripheral surface to an area of the peripheral surface is less than or equal to 0.05.

According to an embodiment of the invention, the holding structure is disposed on the peripheral surface and a portion of the bottom surface of the micro device.

According to an embodiment of the invention, a ratio of an area of the holding structure occupying the bottom surface to an area of the bottom surface is less than or equal to 0.5.

According to an embodiment of the invention, the holding structure includes a holding element and a buffering element, and a material of the holding element is different from a material of the buffering element.

According to an embodiment of the invention, the holding structure includes at least one covering portion and at least one connecting portion. The covering portion covers a portion of the top surface, and the connecting portion connects the covering portion from an edge of the top surface and connects the substrate.

According to an embodiment of the invention, a maximum thickness of the covering portion is less than or equal to a minimum thickness of the connecting portion.

According to an embodiment of the invention, the covering portion includes a lower surface and a non-planar surface, and the lower surface contacts the top surface of the micro device.

According to an embodiment of the invention, the micro device further includes an insulating layer, and the insulating layer at least covers the peripheral surface and a portion of the bottom surface. The holding structure is directly in contact with the insulating layer.

According to an embodiment of the invention, the holding structure only contacts the insulating layer.

According to an embodiment of the invention, a material of the holding structure is different from a material of the insulating layer.

According to an embodiment of the invention, a minimum distance between the holding structure and the substrate is less than a vertical thickness between the micro device and the substrate.

According to an embodiment of the invention, a ratio of a minimum thickness to a maximum thickness of the holding structure on the substrate is greater than 0.2.

According to an embodiment of the invention, a vertical distance between the holding structure and the substrate in a normal direction of the substrate is gradually decreased from the boundary between the top surface and the peripheral surface of the micro device to the substrate.

Based on the above, in the design of the structure with micro device of the invention, from the cross-sectional view, thickness of the holding structure is not fixed from the boundary between the top surface and the peripheral surface of the micro device to the substrate. With such design, when the micro device is delivered and transferred between different substrates to be applied to, for example, a micro device display, the breaking point of the holding structure can be controlled to be close to the boundary between the top surface and peripheral surface of the micro device, thereby reducing the problem that the holding structure is not completely broken or remained, such that the yield rate of delivery and transfer of the micro LED can be improved.

In order to make the aforementioned features and advantages of the disclosure more comprehensible, embodiments accompanying figures are described in detail below.

BRIEF DESCRIPTION OF THE DRAWINGS

FIG. 8C is a schematic three-dimensional view of a structure with micro device according to another embodiment of the invention.

DESCRIPTION OF EMBODIMENTS

The embodiments of the invention describe the structure of micro device (e.g., micro LED) and micro chip) that is ready to be picked up and transferred to a receiving substrate. The receiving substrate may be, for example, a display substrate, a substrate having functional element such as transistor or integrated circuit (ICs) or other substrates with circuit, the invention is not limited thereto. Although some embodiments of the invention focus on micro LED containing p-n diode, it should be understood that the embodiments of the invention are not limited thereto. Some embodiments may be applied to other micro devices, and the devices are designed in this manner to control execution of predetermined electronic function (e.g., diode, transistor, integrated circuit) or photon function (e.g., LED, laser).

Figure 1A:
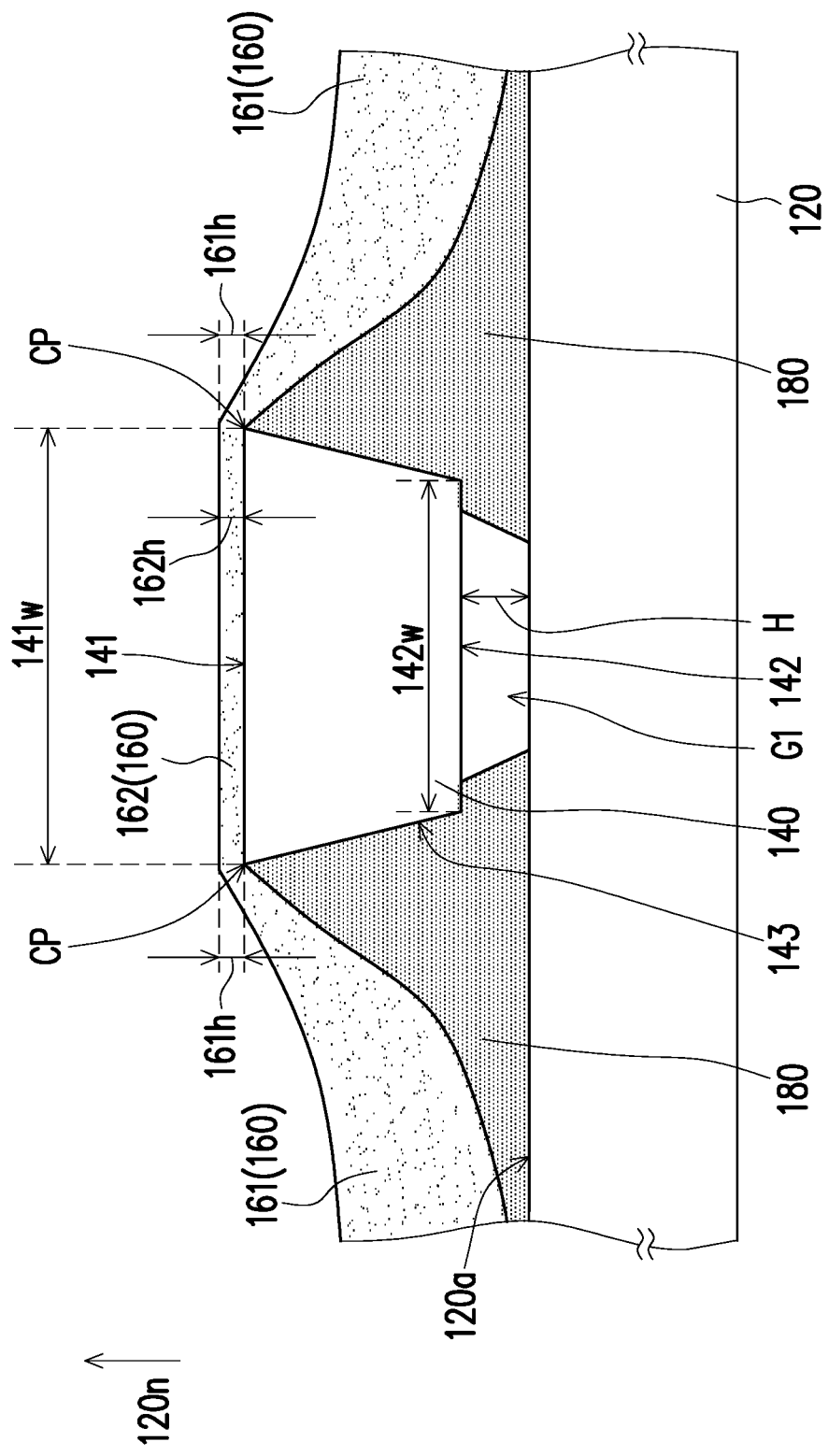
FIG. 1A is a schematic cross-sectional view of a structure with micro device according to a first embodiment of the invention.
Figure 1B:
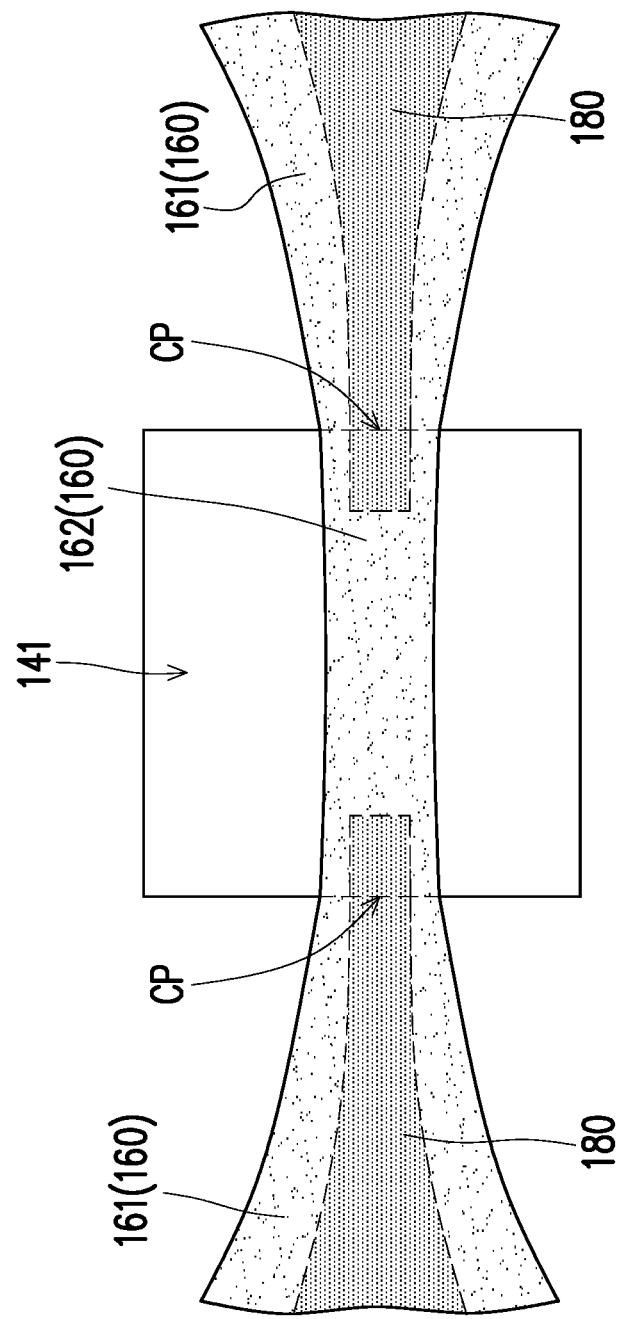
FIG. 1B is a schematic top view of the structure with micro device in FIG. 1A.

FIG. 1A is a schematic cross-sectional view of a structure with micro device according to a first embodiment of the invention. FIG. 1B is a schematic top view of the structure with micro device in FIG. 1A. Referring to FIG. 1A, a structure with micro device 100 in the embodiment includes a substrate 120, at least one micro device 140, and at least one holding structure 160 and at least one buffering structure 180. The micro device 140 is disposed on the substrate 120 and has a top surface 141 relatively far away from the substrate 120, a bottom surface 142 opposite to the top surface 141 and a peripheral surface 143 connecting the top surface 141 and the bottom surface 142. The holding structure 160 is disposed on the substrate 120. From the cross-sectional view, the thickness of the holding structure 160 in a normal direction 120n of the substrate 120 is gradually increased from a boundary CP between the top surface 141 and the peripheral surface 143 of the micro device 140 to the substrate 120. The buffering structure 180 is disposed between the holding structure 160 and the substrate 120, wherein the holding structure 160 is connected to the substrate 120 through the buffering structure 180.

In the embodiment, the substrate 120 is a temporary substrate that may have fixity and flat surface such as a plastic substrate, a glass substrate or a sapphire substrate, the invention is not limited thereto. As shown in the embodiment of FIG. 1A, the number of the micro device 140 is exemplified as one, but not limited thereto. In other embodiments, the number of the micro device 140 may be plural. Herein, a width 141w of the top surface 141 is larger than a width 142w of the bottom surface 142 such that a better tolerance rate and a better yield rate can be achieved when the micro device 140 is subsequently picked up by a transfer equipment (not shown) from the top surface 141. Briefly, the cross-sectional view of the micro device 140 may be an inverted trapezoid shape, but not limited thereto. Specifically, in the embodiment, the area of the bottom surface 142 of the micro device 140 is smaller than the area of the top surface 141 of the micro device 140, and the orthogonal projection of the bottom surface 142 of the micro device 140 on the substrate 120 falls within the orthogonal projection of the top surface 141 of the micro device 140 on the substrate 120 such that the micro device 140 has a better tolerance rate and a better yield rate when the micro device 140 is subsequently picked up by a transfer equipment (not shown) from the top surface 141. Herein, the micro device 140 may be a micro LED, and a largest size of the micro device 140 is smaller than or equal to 100 μm. Preferably, a largest size of the micro device 140 is smaller than or equal to 50 μm, and is thus more suitable to be applied to LED display technique using micro LED as pixel. In other embodiments, the micro device 140 may be a micro IC, a micro LD or a micro sensor, but not limited thereto.

Furthermore, a vertical distance H may be formed between the micro device 140 and the substrate 120 in the embodiment. In other words, the micro device 140 and the substrate 120 may not be directly in contact with each other. In some embodiments, the vertical distance H may be smaller than the maximum deformation amount of the holding structure 160. Herein, the maximum deformation amount refers to the value that causes the holding structure 160 to break. That is, the moving distance of the holding structure 160 along the vertical substrate exceeds the vertical distance H between the micro device 140 and the substrate 120, and the holding structure 160 may be broken. Herein, the vertical distance H is designed based on the height of the micro device 140. Preferably, the vertical distance H is larger than 0 and smaller than 0.5 times the height of the micro device 140. If the vertical distance H is larger than 0.5 times the height of the micro device 140, the height difference of the holding structure 160 is too large, as a result, the holding structure is difficult to be manufactured and might be broken easily. Generally speaking, the vertical distance H is in a range between 0.1 μm and 5 μm, but not limited thereto. Specifically, from the cross-sectional view, in the normal direction 120n of the surface 120a of the substrate 120, the thickness of the holding structure 160 is gradually increased from the boundary CP between the top surface 141 and the peripheral surface 143 of the micro device 140 to the surface 120a of the substrate 120. In other words, the holding structure 160 has a smallest thickness 161h at the boundary CP, and the thickness of the holding structure 160 is increased toward the direction of the substrate 120. That is to say, the thickness of the holding structure 160 is not fixed.

Furthermore, in the embodiment, the holding structure 160 may include a covering portion 162 and a plurality of connecting portions 161. As shown in FIG. 1B, the covering portion 162 covers a portion of the top surface 141 of the micro device 140. The connecting portion 161 connects the covering portion 162 from two opposite edges (i.e., two boundaries CP between the top surface 141 and the peripheral surface 143) of the top surface 141 and covers the buffering structure 180. That is, the connecting portion 161 extends from the boundary CP between the top surface 141 and the peripheral surface 143 of the micro device 140 to the substrate 120. Moreover, in the normal direction 120n of the surface 120a of the substrate 120, the thickness of the connecting portion 161 is gradually increased from the boundary CP to the surface 120a of the substrate 120. Briefly, the connecting portion 161 has the smallest thickness 161h at the boundary CP between the top surface 141 and the peripheral surface 143. The smallest thickness 161h is smaller than or equal to 1 μm. If the smallest thickness 161h is larger than 1 μm, it might increase the difficulty of the pick-up and transferring processes subsequently. As shown in FIG. 1A, a thickness 162h of the covering portion 162 may be consistent (if the possible rough surface of the covering portion 162 is neglected), and basically the thickness 162h of the covering portion 162 may be identical with the smallest thickness 161h of the connecting portion 161, but not limited thereto. It should be pointed out that a ratio of an orthogonal projection area of the holding structure 160 on the top surface 141 of the micro device 140 to an area of the top surface 141 is smaller than or equal to 0.2. If the ratio is larger than 0.2, the pick-up flatness of a transfer equipment (not shown) on the top surface 141 might be affected and consequently affecting the difficulty of the pick-up process.

Additionally, the buffering structure 180 of the embodiment is disposed between the holding structure 160 and the substrate 120 such that the connecting portion 161 of the holding structure 160 can be connected to the substrate 120 through the corresponding buffering structure 180. In the embodiment shown in FIG. 1A, the number of the buffering structure 180 is exemplified as two, but not limited thereto. In the embodiment, the material of the holding structure 160 is different from the material of the buffering structure 180, and the Young's modulus of the holding structure 160 is larger than the Young's modulus of the buffering structures 180. For example, the material of the holding structure 160 is, for example, silicon dioxide, silicon nitride, spin on glass (SOG) or other suitable inorganic materials, and the material of the buffering structure 180 is, for example, an organic material. The buffering structure 180 can absorb the external force that is applied to the holding structure 160 when holding the micro device 140 in the delivering and transferring processes, thereby improving the yield rate of delivery and transfer. Herein, in a unit area, a ratio of the orthogonal projection area of the buffering structure 180 on the substrate 120 to the orthogonal projection area of the holding structure 160 on the substrate 120 is in a range between 0.2 and 0.9. If the ratio is larger than 0.9, the holding force of the buffering structure 180 is too large, which affects subsequent transferring process. If the ratio is smaller than 0.2, the buffering force of the buffering structure 180 is not enough. More specifically, the buffering structure 180 of the embodiment completely covers the peripheral surface 143 of the micro device 140 and extends to cover a portion of the bottom surface 142, thereby achieving a better buffering effect. As shown in FIG. 1A, there may be no component provided between the buffering structure 180, the micro device 140 and the substrate 120. In other words, an air gap G1 is formed between the buffering structure 180, the micro device 140 and the substrate 120.

When the micro device 140 is picked up from the substrate 120, the force for picking up (e.g., press-down force or pull-up force) causes the holding structure 160 to break. Since the connecting portion 161 of the holding structure 160 has the smallest thickness 161h at the position of the boundary CP between the top surface 141 and the peripheral surface 143 of the corresponding micro device 140, and the micro device 140 is designed in a shape that is wide at the top and narrow at the bottom, the breaking point of the holding structure 160 can be close to or substantially located at the boundary CP between the top surface 141 and the peripheral surface 143 of the micro device 140. In this manner, the problem that the holding structure 160 is not completely broken or remained may be reduced, thereby improving the yield rate of delivering and transferring the micro device 140 to the subsequent circuit substrate (not shown).

It is to be explained that, the following embodiment has adopted component notations and part of the contents from the previous embodiment, wherein the same notations are used for representing the same or similar components, and descriptions of the same technical contents are omitted. The descriptions regarding the omitted part may be referred to the previous embodiments, and thus are not repeated herein.

Figure 2:
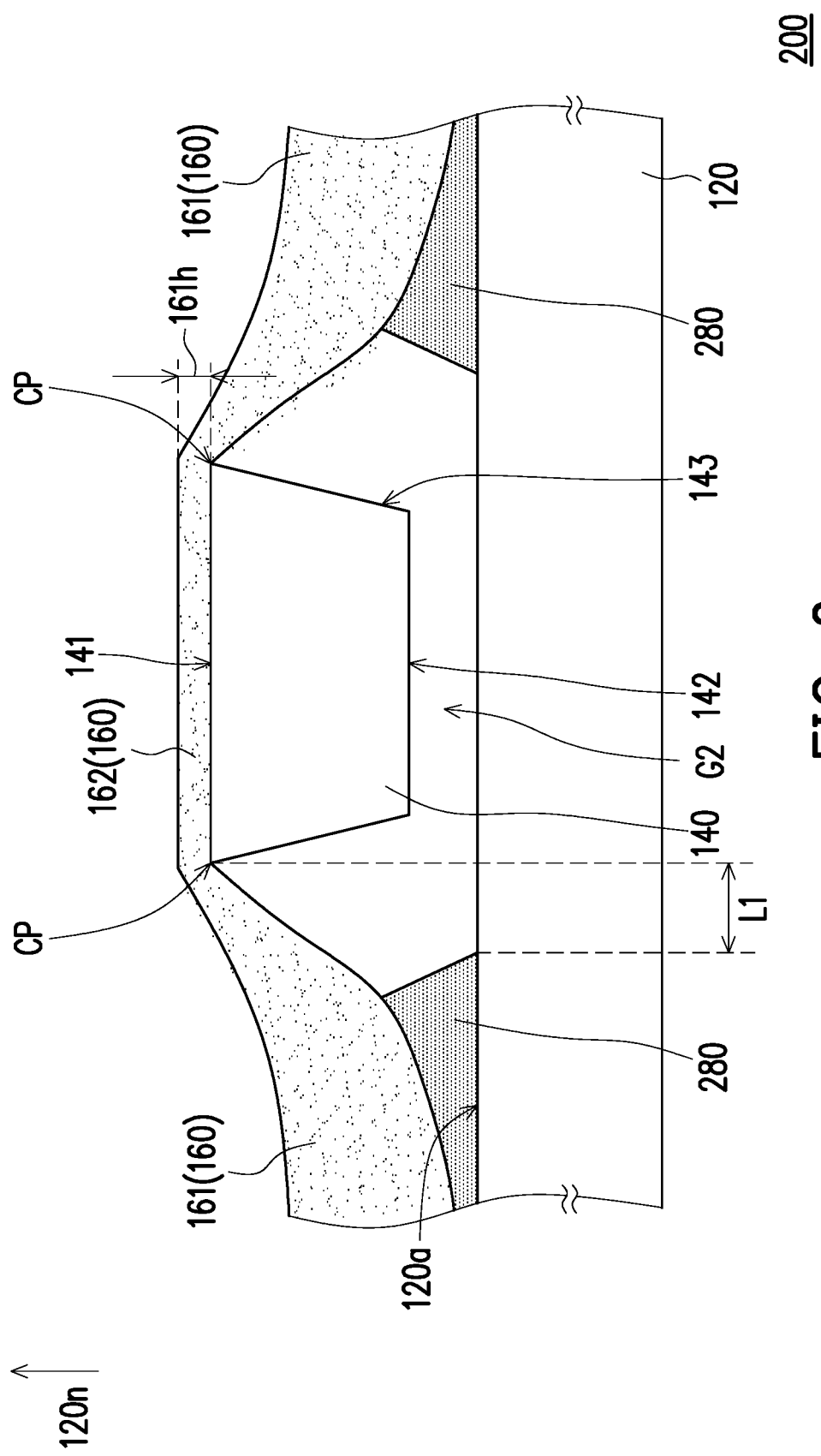
FIG. 2 is a schematic cross-sectional view of a structure with micro device according to a second embodiment of the invention.

FIG. 2 is a schematic cross-sectional view of a structure with micro device according to a second embodiment of the invention. A structure with micro device 200 in the embodiment is similar to the structure with micro device 100 in the first embodiment, and the difference between the two is that the configuration of a buffering structure 280 of the structure with micro device 200 in the embodiment is different from the configuration of the buffering structure 180 of the structure with micro device 100. In the embodiment, the buffering structure 280 is not in contact with the bottom surface 142 and the peripheral surface 143 of the micro device 140. In this manner, an air gap G2 is formed between the buffering structure 280 and the peripheral surface 143 of the micro device 140 and between the buffering structure 280, the bottom surface 142 of the micro device 140 and the substrate 120.

More specifically, the orthogonal projection of the buffering structure 280 on the surface 120a of the substrate 120 does not overlap the orthogonal projection of the micro device 140 on the surface 120a of the substrate 120. Moreover, a smallest distance L1 may be formed between the orthogonal projection of the buffering structure 280 on the substrate 120 and the orthogonal projection of the micro device 140 on the substrate 120, and the smallest distance L1 is smaller than or equal to 10 μm. With the configuration that the buffering structure 280 is not directly in contact with the micro device 140, it can be avoided that the holding force is too large and affects the subsequent pick-up force.

Figure 3A:
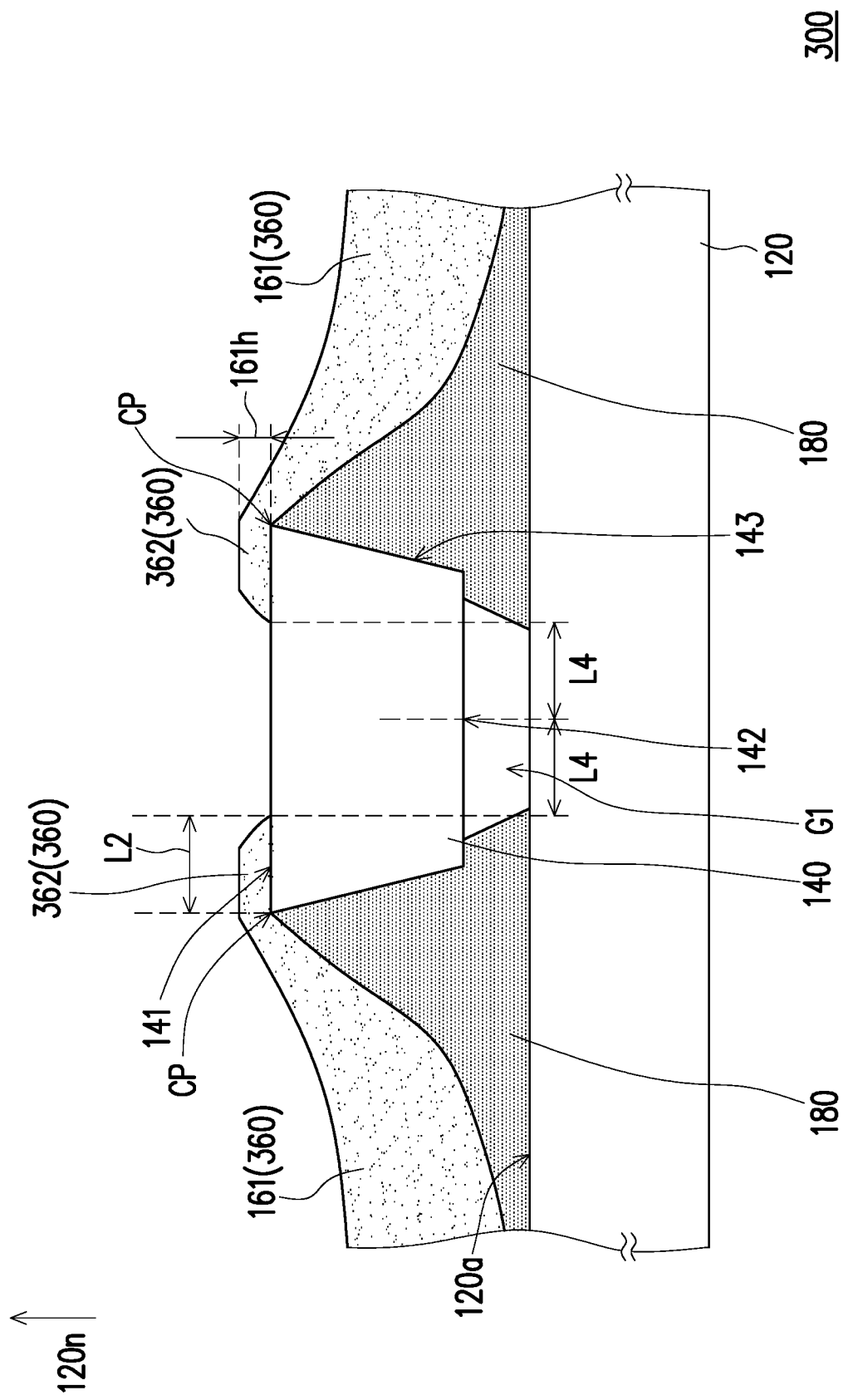
FIG. 3A is a schematic cross-sectional view of a structure with micro device according to a third embodiment of the invention.
Figure 3B:
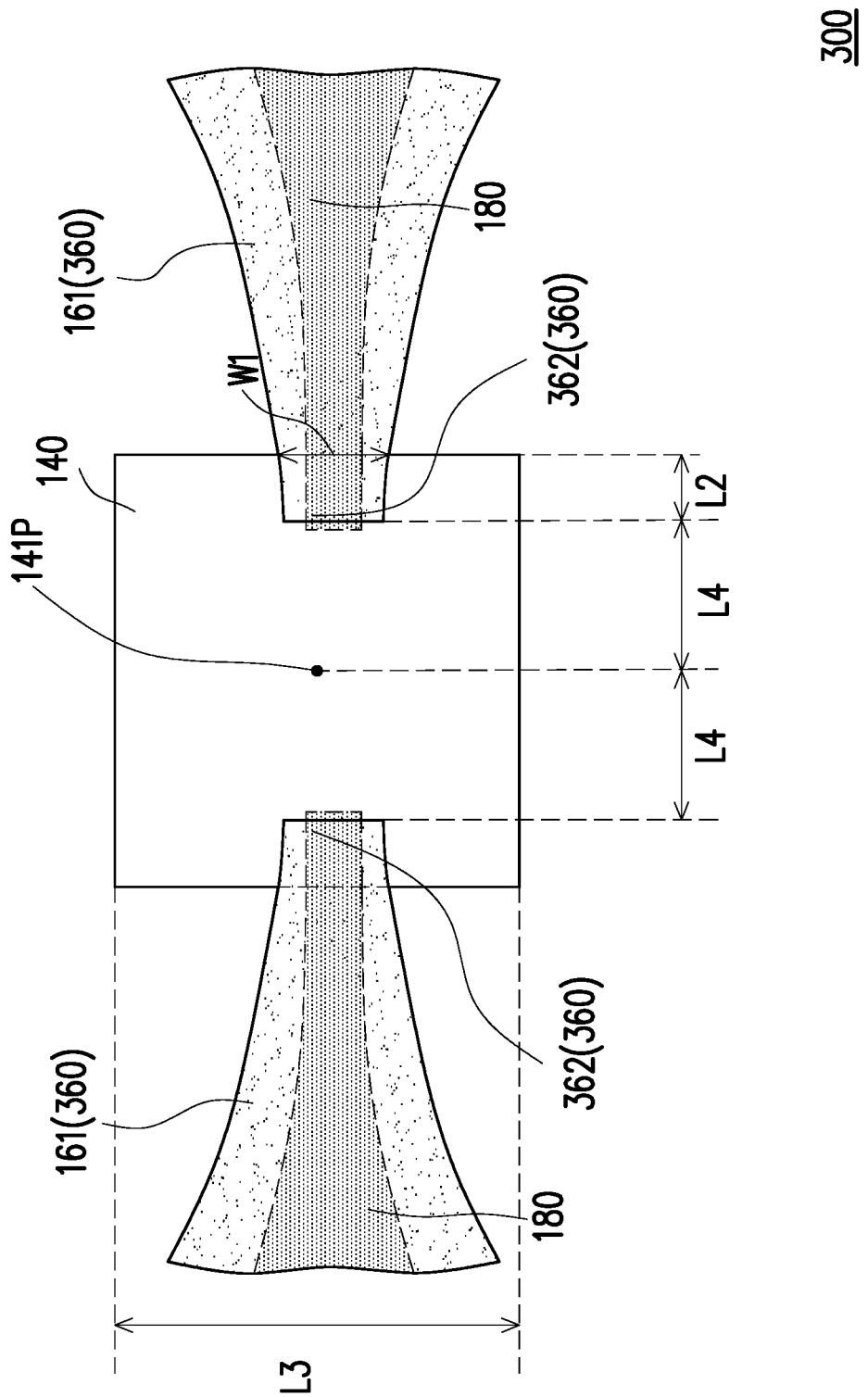
FIG. 3B is a schematic top view of a structure with micro device in FIG. 3A.

FIG. 3A is a schematic cross-sectional view of a structure with micro device according to a third embodiment of the invention. FIG. 3B is a schematic top view of a structure with micro device in FIG. 3A. A structure with micro device 300 in the embodiment is similar to the structure with micro device 100 in the first embodiment, and the difference between the two is that a holding structure 360 of the embodiment includes a plurality of covering portions 362 and a plurality of connecting portions 161, wherein the covering portions 362 are separated from each other and cover a portion of the top surface 141, and the connecting portion 161 connects the covering portion 362 from two opposite edges (i.e., two boundaries CP between the top surface 141 and the peripheral surface 143) of the top surface 141 and covers the buffering structure 180.

Figure 3C:
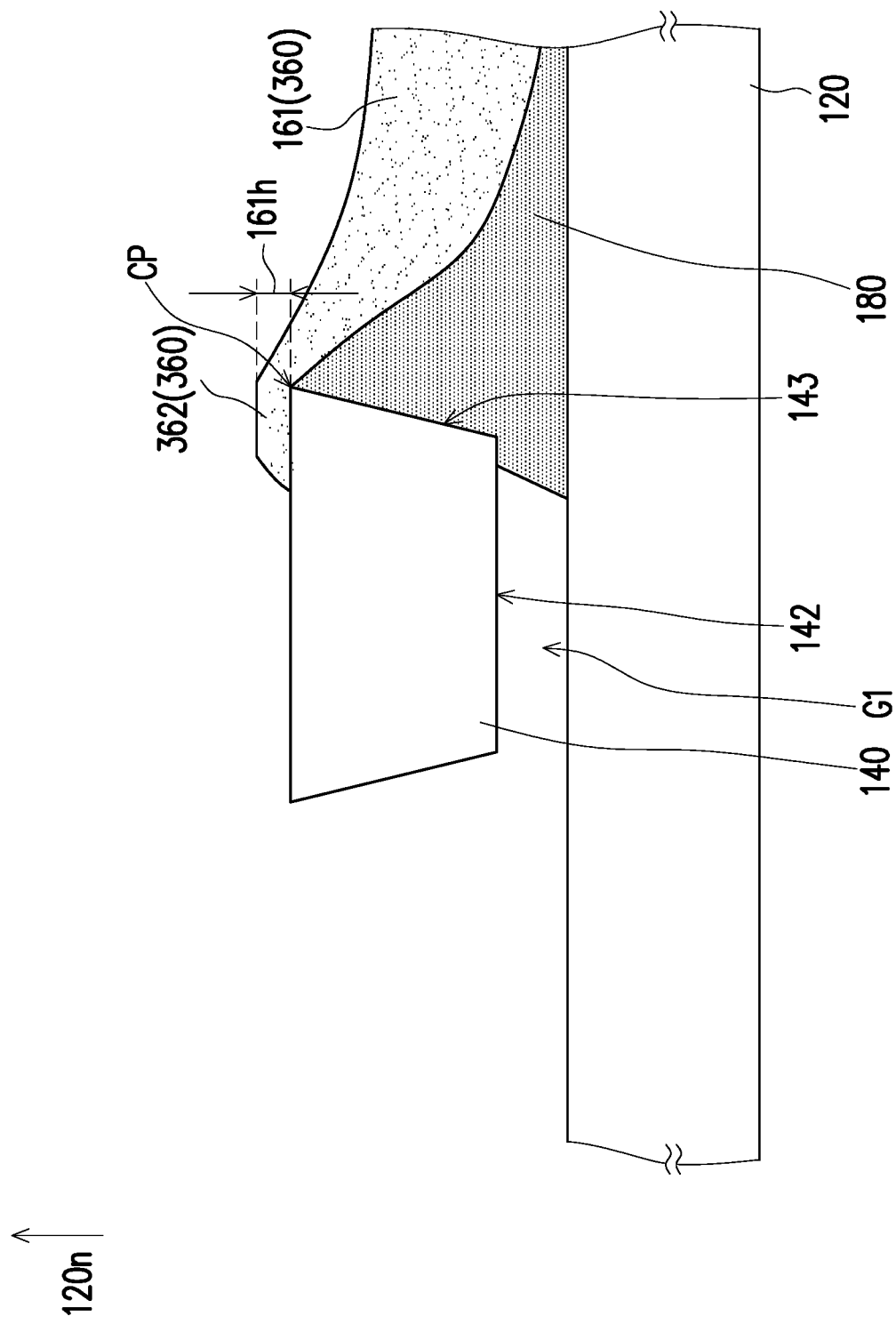
FIG. 3C is a schematic cross-sectional view of a structure with micro device according to a fourth embodiment of the invention.

More specifically, as shown in FIG. 3B, a largest distance L2 is formed between the covering portion 362 of the holding structure 360 and the corresponding edge of the top surface 141 of the micro device 140, and a ratio of the largest distance L2 to a length L3 of the edge is smaller than or equal to 0.2. The largest distance L2 is, for example, smaller than or equal to 10 μm. If the largest distance is larger than 10 μm, it might increase the difficulty of the pick-up process. Preferably, the largest distance L2 is, for example, smaller than or equal to 5 μm such that the subsequent pick-up process is easier, and the holding structure 360 can effectively hold the micro device 140. Additionally, a ratio of a width W1 of the connecting portion 161 on the edge of the top surface 141 of the micro device 140 to the length L3 of the corresponding edge is in a range between 0.01 and 0.6. If the ratio is smaller than 0.01, the holding structure 360 cannot effectively hold the micro device 140. That is, the holding force provided by the holding structure 360 is not big enough; on the contrary, if the ratio is larger than 0.6, the holding force provided by the holding structure 360 is too large, which causes that the micro device 140 cannot be smoothly picked up from the substrate 120. The width W1 is, for example, smaller than or equal to 20 μm. It should be indicated that the plurality of covering portions 362 and the plurality of connecting portions 161 are symmetrically disposed on two opposite edges of the top surface 141, and the shortest distances L4 from the orthogonal projection of the center 141P of the micro device 140 on the substrate 120 to each of the covering portions 362 are substantially the same, thereby providing a better subsequent transfer yield rate. It should be pointed out that the holding structure 360 and the buffering structure 180 may be only disposed on an edge of the micro device 140 as a structure with micro device 300' shown in FIG. 3C. In other words, the holding structure 360 only includes one covering portion 362 and one connecting portion 161. The covering portion 362 covers a portion of the top surface 141, the connecting portion 161 connects the covering portion 362 from an edge of the top surface 141 and covers the buffering structure 180, but not limited thereto.

Figure 4:
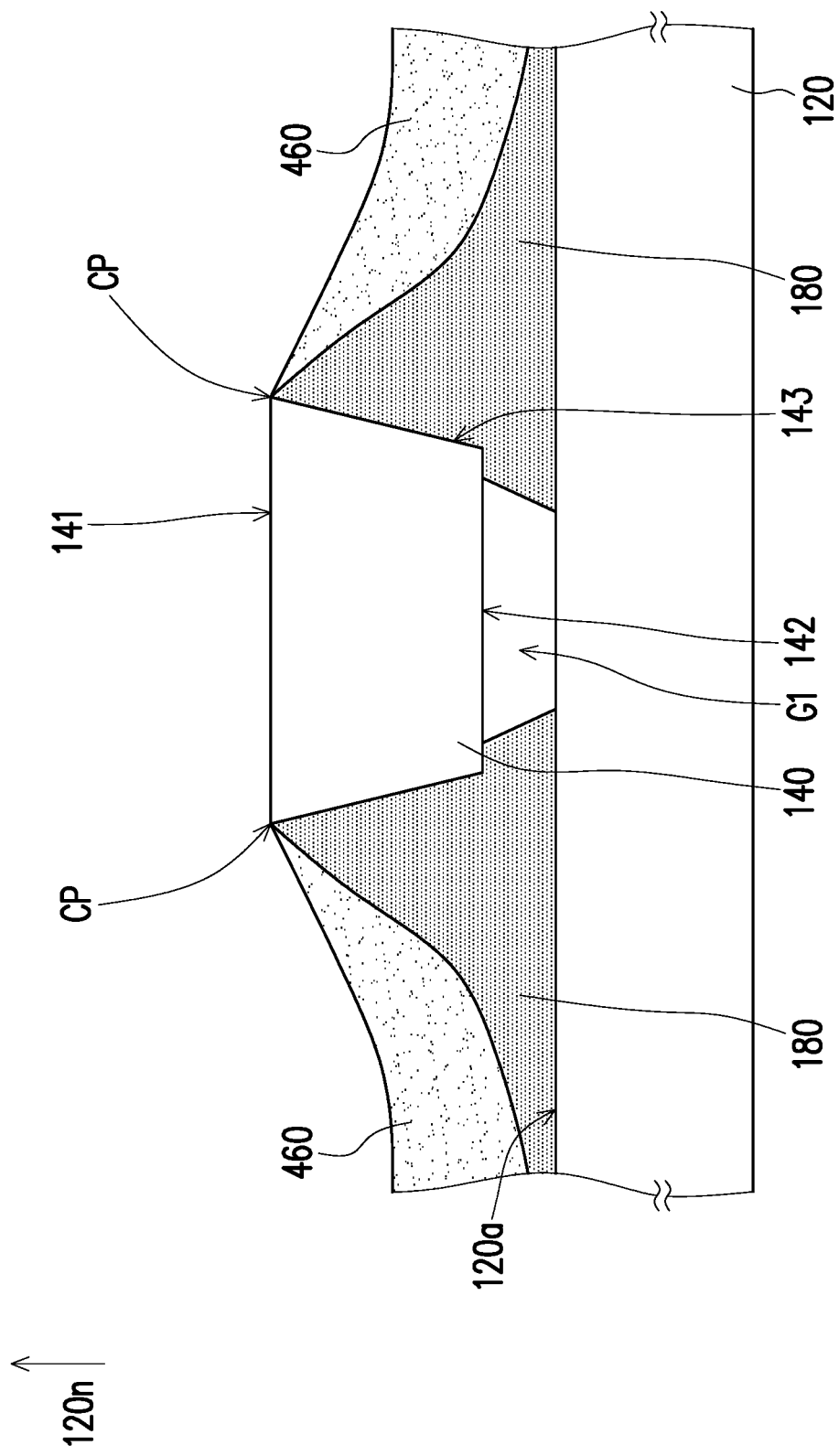
FIG. 4 is a schematic cross-sectional view of a structure with micro device according to a fifth embodiment of the invention.

FIG. 4 is a schematic cross-sectional view of a structure with micro device according to a fifth embodiment of the invention. A structure with micro device 400 in the embodiment is similar to the structure with micro device 100 in the first embodiment, and the difference between the two is that a holding structure 460 of the embodiment completely exposes the top surface 141 of the micro device 140 and covers the buffering structure 180, wherein the buffering structure 180 completely covers the peripheral surface 143 of the micro device 140 and extends to cover a portion of the bottom surface 142. However, in other embodiments, the buffering structure 180 may only cover a portion of the peripheral surface 143 of the micro device 140, but not limited thereto.

Figure 5:
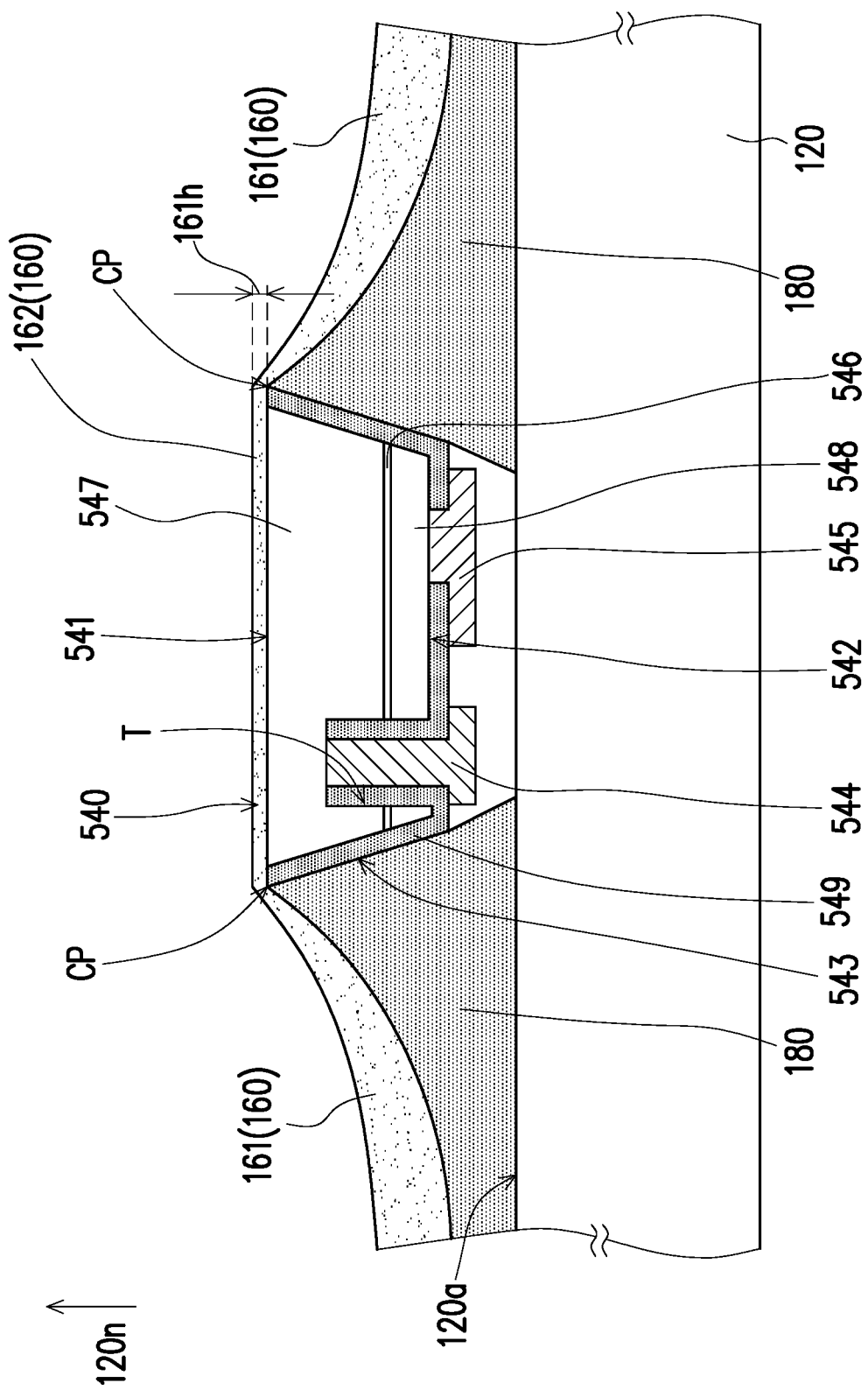
FIG. 5 is a schematic cross-sectional view of a structure with micro device according to a sixth embodiment of the invention.

FIG. 5 is a schematic cross-sectional view of a structure with micro device according to a sixth embodiment of the invention. A structure with micro device 500 of the embodiment is similar to the structure of the micro device 100 of the first embodiment, and the difference between the two is that a micro device 540 of the embodiment includes a first type electrode 544 and a second type electrode 545 disposed on the same surface. Specifically, the micro device 540 includes a first type semiconductor layer 547, a light emitting layer 546, a second type semiconductor layer 548, an insulating layer 549, a through hole T, the first type electrode 544 and the second type electrode 545. The through hole T penetrates through the second type semiconductor layer 548, the light emitting layer 546 and a portion of the first type semiconductor layer 547 in sequence. The insulating layer 549 covers the peripheral surface 543, a portion of the bottom surface 542 and the inner wall of the through hole T. The holding structure 160 is directly in contact with the top surface 541 and the insulating layer 549 disposed on the peripheral surface 543. The first type electrode 544 and the second type electrode 545 are disposed on the bottom surface 542, and the first type electrode 544 is filled in the through hole T and electrically connected with the first type semiconductor layer 547, and the second type electrode 545 passes through the insulating layer 549 on the bottom surface 542 and electrically connected with the second type semiconductor layer 548.

In the embodiment, the material of the holding structure 160 may be different from the material of the insulating layer 549, wherein the material of the holding structure 160 is an inorganic material, such as silicon dioxide, silicon nitride, spin on glass (SOG) or other suitable materials. Herein, the material of the insulating layer 549 is an inorganic material such as silicon dioxide, silicon nitride, spin on glass (SOG) or other suitable material in order to protect the micro device 540 from being affected by outer environment, thereby increasing the service life of the micro device 540. In the embodiment, the holding structure 160 is SOG, the insulating layer 549 is $SiO_2$, but not limited thereto. Preferably, the hardness of the holding structure 160 is lower than or equal to the hardness of the insulating layer 549. Preferably, the thickness of the holding structure 160 is smaller than or equal to the thickness of the insulating layer 549. In this manner, it can be avoided that the holding structure 160 and the insulating layer 549 are removed simultaneously when the micro device 540 is transferred. Additionally, the center of gravity of the holding structure 160 is lower than the center of gravity of the micro device 140 and thus a more stable holding effect can be achieved.

Figure 6A:
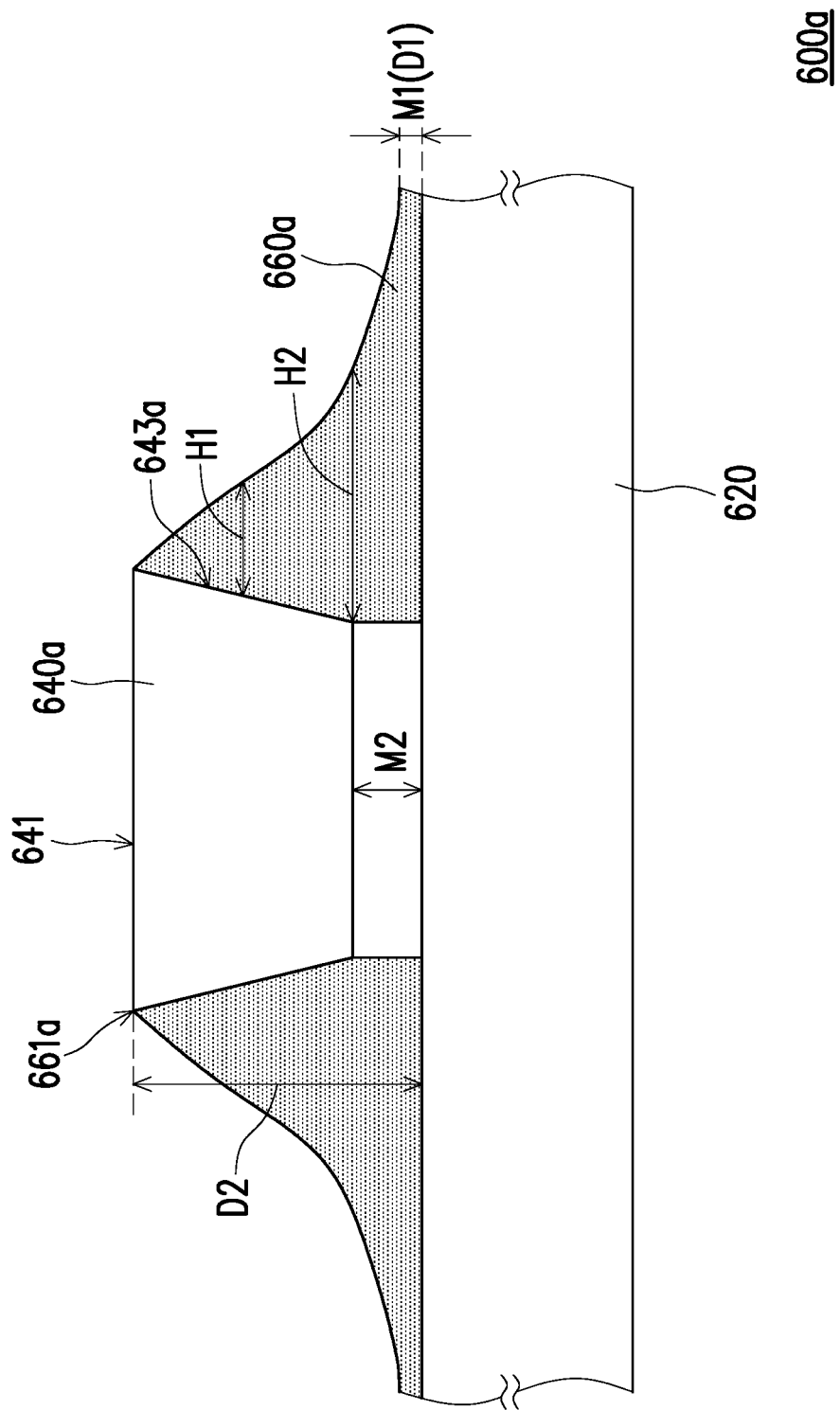
FIG. 6A is a partial schematic cross-sectional view of a structure with micro device according to another embodiment of the invention.
Figure 6B:
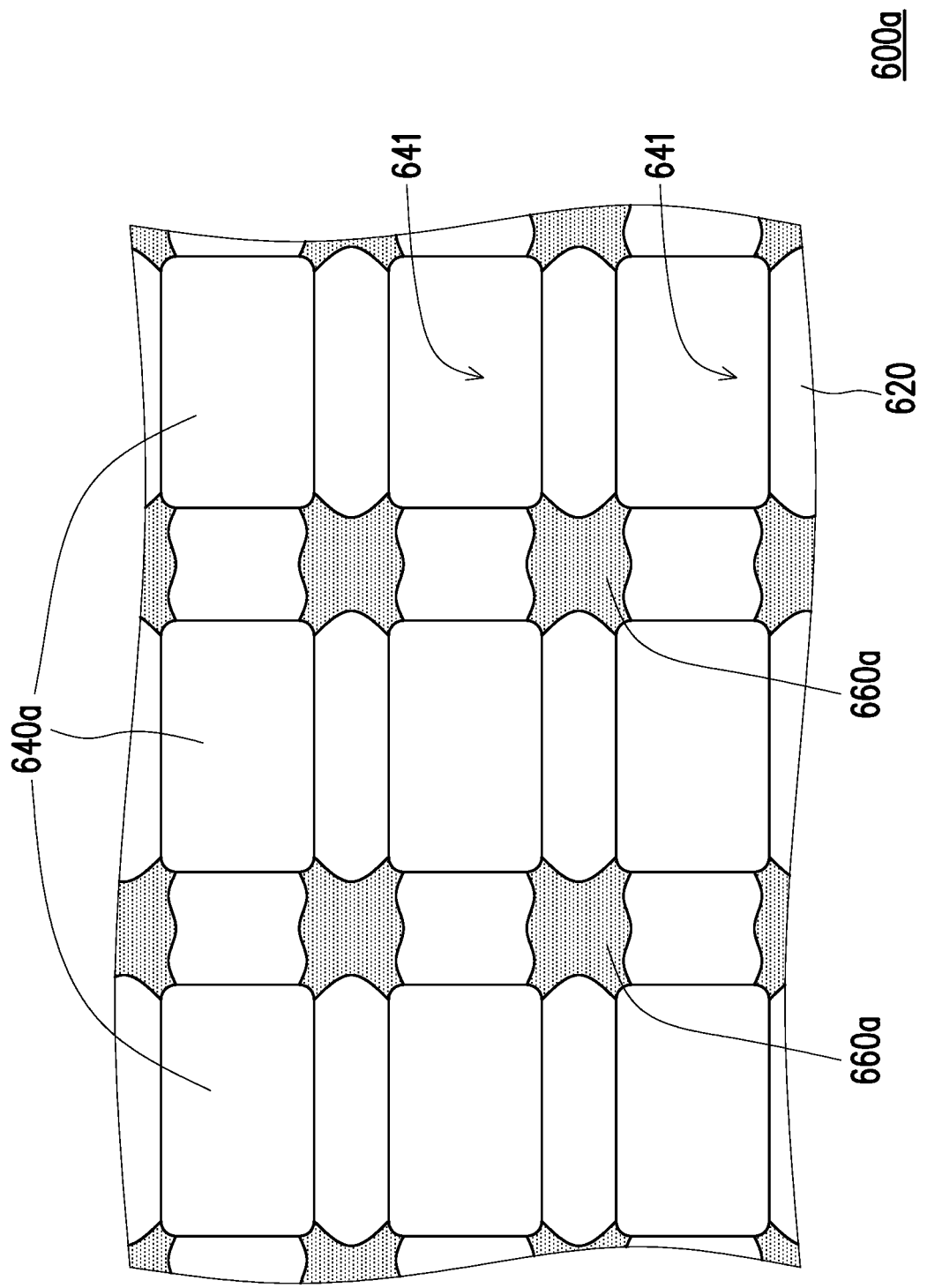
FIG. 6B is a schematic top view of the structure with micro device in FIG. 6A.
Figure 6C:
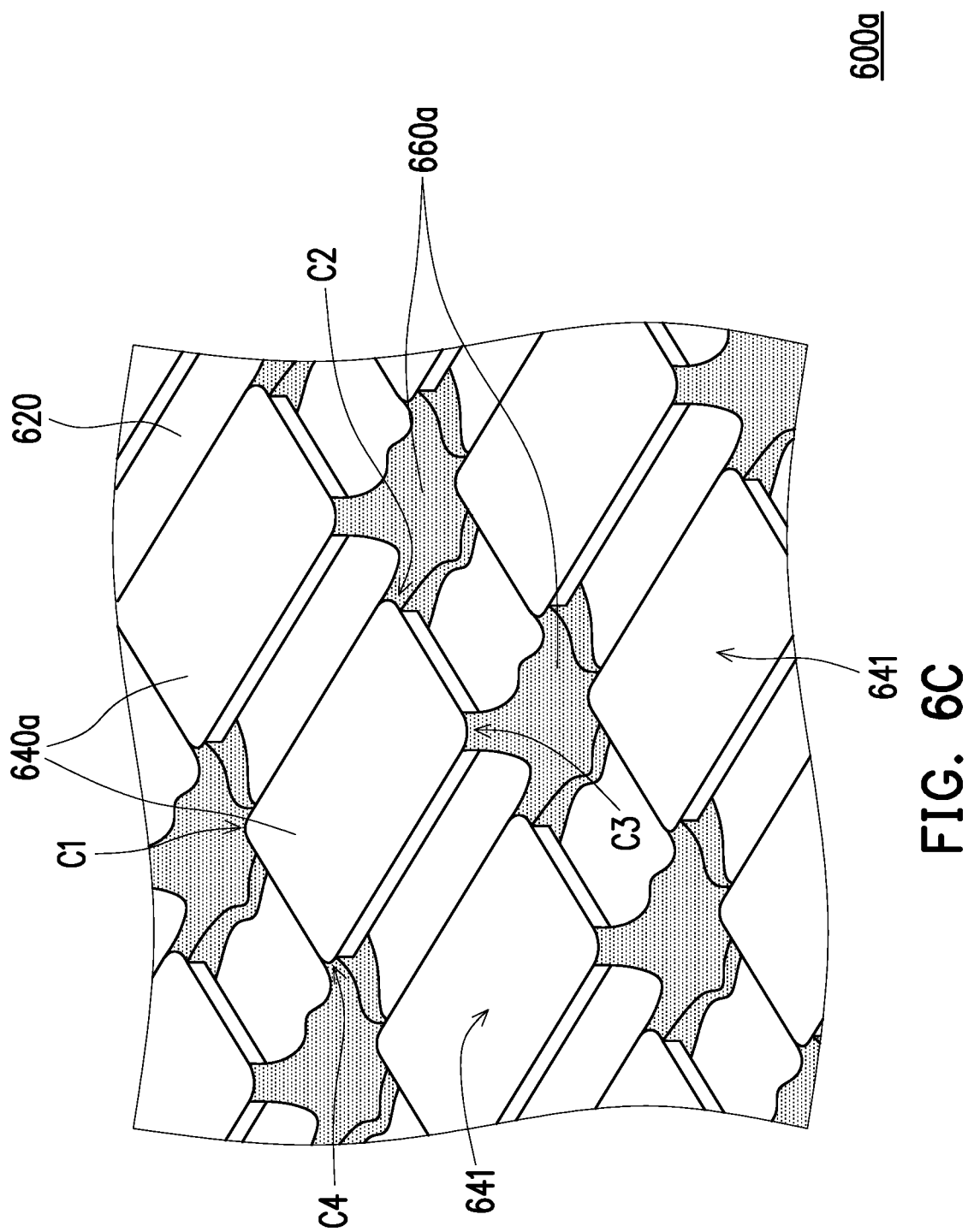
FIG. 6C is a schematic three-dimensional view of the structure with micro device in FIG. 6A.

FIG. 6A is a partial schematic cross-sectional view of a structure with micro device according to another embodiment of the invention. FIG. 6B is a schematic top view of the structure with micro device in FIG. 6A. FIG. 6C is a schematic three-dimensional view of the structure with micro device in FIG. 6A. Referring to FIG. 6A, a structure with micro device 600a of the embodiment is similar to the structure of the micro device 400 of the fifth embodiment, and the difference between the two is that the thickness of the holding structure 660a is not fixed from the boundary between the top surface 641 and the peripheral surface 643a of the micro device 640a to the substrate 620. The micro device 640a is directly connected to the substrate 620 through the holding structure 660a. Specifically, the horizontal distance H1, H2 between the holding structure 660a and the substrate 620 in a direction parallel to the substrate 620 is gradually increased from the boundary between the top surface 641 and the peripheral surface 643a of the micro device 640a to the substrate 620. Herein, the horizontal distance H2 is greater than the horizontal distance H1. Since the top surface 641 of the micro device 640a has an angle with the peripheral surface 643a, the holding structure 660a without a fixed thickness forms a break point at the time of the subsequent transfer at the above-mentioned boundary, and the residual can be avoided, and the relatively good fixing force can be obtained.

Referring to FIG. 6A, FIG. 6B and FIG. 6C, the holding structure 660a completely exposes the top surface 641 of the micro device 640a. Herein, the upper surface 661a of the holding structure 660a is aligned or slightly lower than the top surface 641 of the micro device 640a. Therefore, the holding structure 660a can be effectively supported without being removed due to too much contact area with the micro device 640a. In addition, the holding structure 660a is disposed at the boundary between the top surface 641 and the peripheral surface 643a of the micro device 640a, thereby providing a better subsequent transfer yield rate. Herein, the four holding structures 660a are disposed on the boundary between the top surface 641 and the peripheral surface 643a of the micro device 640a, respectively, and located at the four corners C1, C2, C3 and C4 of the peripheral surface 643a. One holding structures 660a connects four micro devices 640a. Preferably, a ratio of a contact area of the holding structure 660a at the boundary between the top surface 641 and the peripheral surface 643a to an area of the peripheral surface 643a is less than or equal to 0.05. If the above ratio is too large, the holding structure 660a cannot be removed.

Certainly, in other embodiments not shown, the holding structure may also be composed of a holding element (i.e. the holding structure 460 as shown in FIG. 4) and a buffering element (i.e. the buffering structure 180 as shown in FIG. 4) as in the previous embodiment. That is, the holding structure may include a material of the holding element is different from a material of the buffering element, which still belong to the scope of the present invention.

Furthermore, a minimum distance M1 between the holding structure 660a and the substrate 620 is less than a vertical thickness M2 between the micro device 640a and the substrate 620, thereby providing a better subsequent transfer yield rate. Preferably, a ratio of a minimum thickness D1 (i.e. the minimum distance MD) to a maximum thickness D2 of the holding structure 660a on the substrate 620 is greater than 0.2. If the above thickness difference is too large, the process is not easy. In addition, from the other side, a vertical distance between (i.e. the minimum thickness D1 and the maximum thickness D2) the holding structure 660a and the substrate 620 in a normal direction of the substrate 620 is gradually decreased from the boundary between the top surface 641 and the peripheral surface 643a of the micro device 640a to the substrate 620.

In short, the holding structure 660a has the smallest thickness at the boundary between the top surface 641 and the peripheral surface 643a of the micro device 640a. With such design, when the micro device 640a is delivered and transferred between different substrates to be applied to, for example, a micro device display, the breaking point of the holding structure 660a can be controlled to be close to the boundary between the top surface 641 and peripheral surface 643a of the micro device 640a, thereby reducing the problem that the holding structure 660a is not completely broken or remained, such that the yield rate of delivery and transfer of the structure with micro device 600a can be improved.

Figure 7:
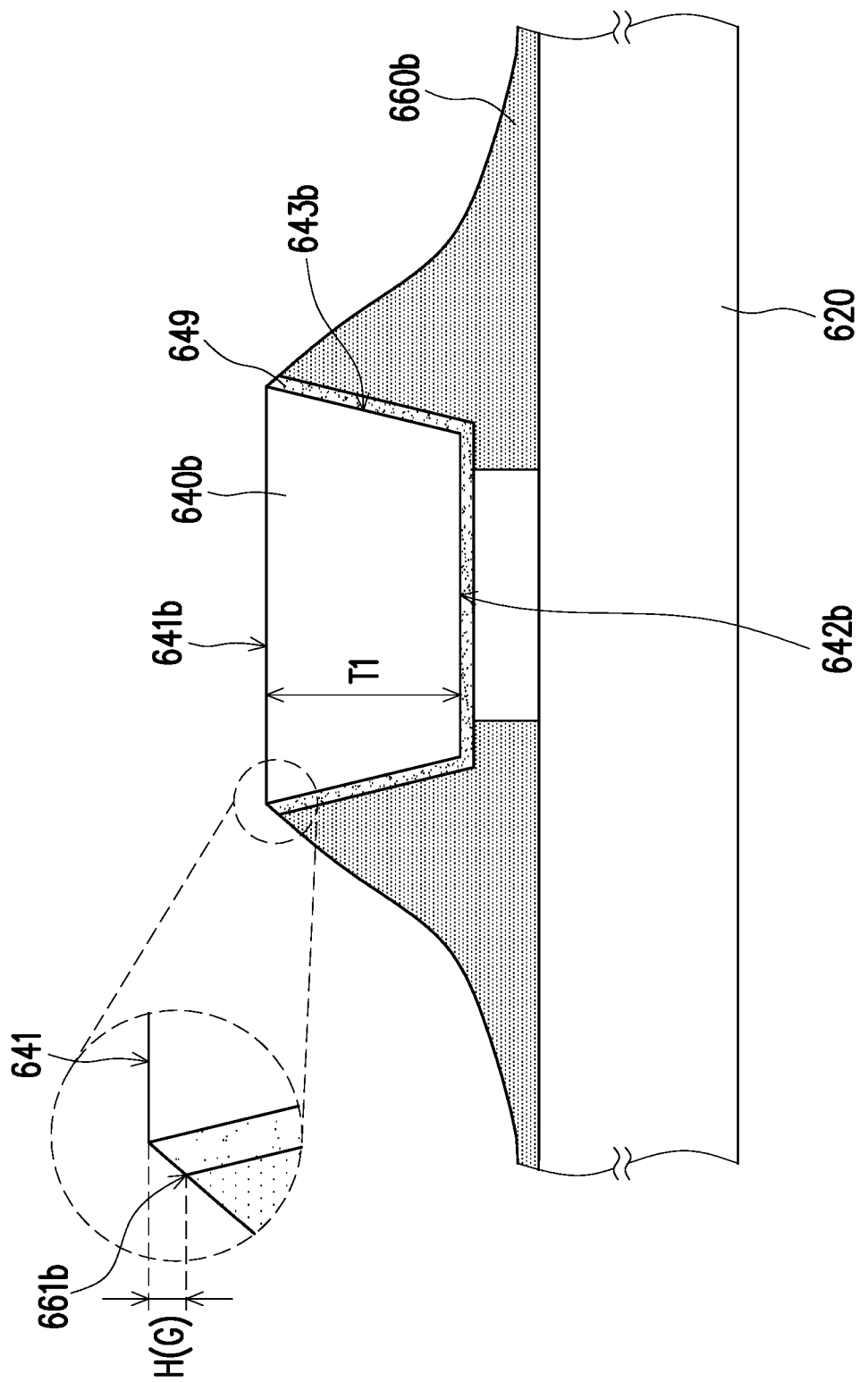
FIG. 7 is a schematic cross-sectional view of a structure with micro device according to another embodiment of the invention.

FIG. 7 is a schematic cross-sectional view of a structure with micro device according to another embodiment of the invention. A structure with micro device 600b of the embodiment is similar to the structure of the micro device 600a of the above embodiment, and the difference between the two is that the upper surface 661b of the holding structure 660b is lower than the top surface 641b of the micro device 640b, there is a gap G between the upper surface 661b and the top surface 641b, and a ratio of a vertical distance H of the gap G to a thickness T1 of the micro device 640b is less than or equal to 0.5. If the above ratio is larger than 0.5, the holding structure 660b cannot effectively hold the micro device 640b.

Furthermore, the micro device 640b further includes an insulating layer 649, and the insulating layer 649 at least covers the peripheral surface 643b and a portion of the bottom surface 642b. The holding structure 660b is directly in contact with the insulating layer 649. The holding structure 660b only contacts the insulating layer 649 and does not contact an epitaxial structure of the micro device 640b, thereby avoiding damage to the epitaxial structure when the holding structure 660b is subsequently removed. Herein, a material of the holding structure 660b is different from a material of the insulating layer 649 to facilitate the removal process of the subsequent holding structure 660b.

Figure 8A:
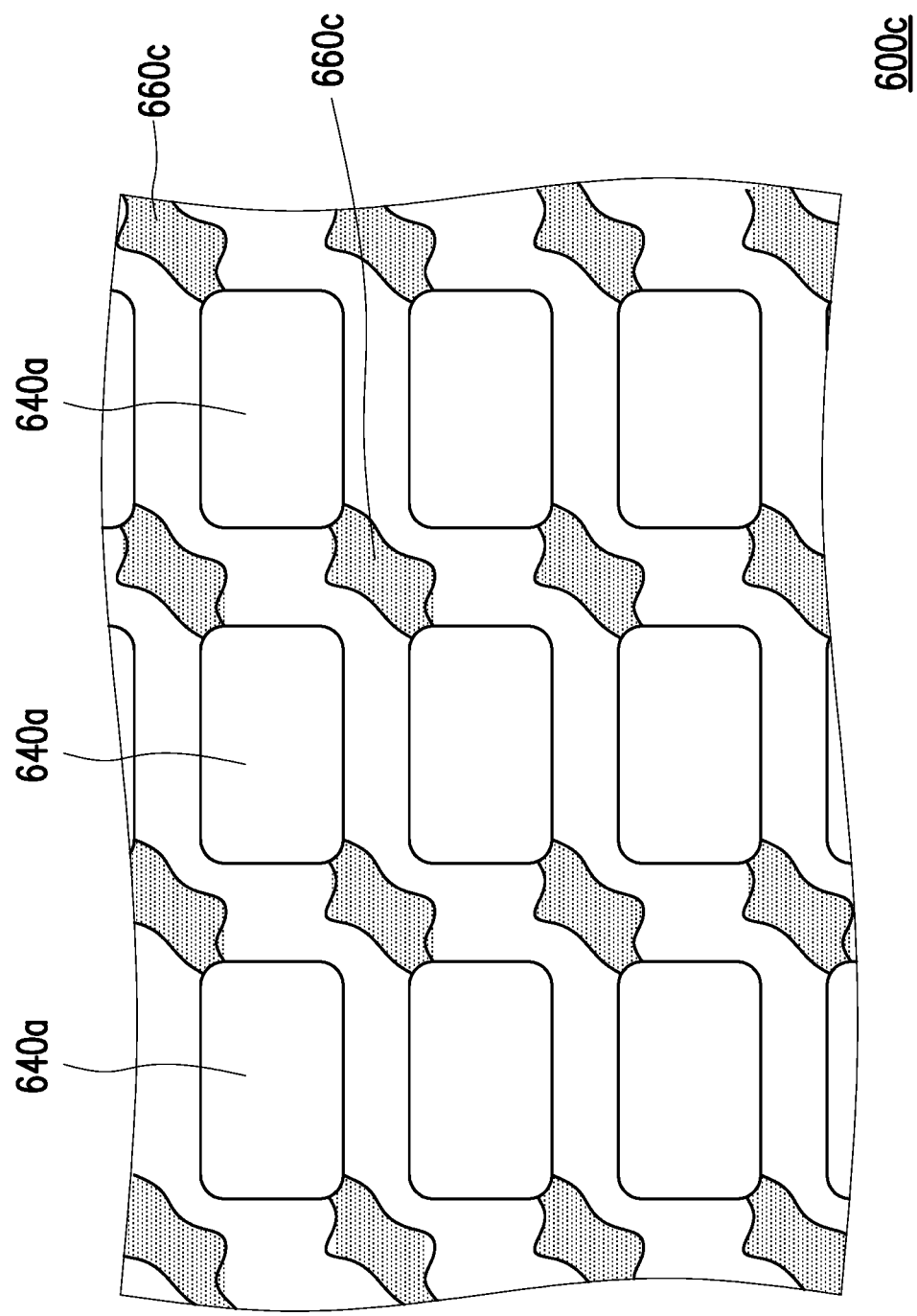
FIG. 8A is a schematic top view of a structure with micro device according to another embodiment of the invention.

FIG. 8A is a schematic top view of a structure with micro device according to another embodiment of the invention. A structure with micro device 600c of the embodiment is similar to the structure of the micro device 600a of the above embodiment, and the difference between the two is that two holding structures 660c are located at two corners of the diagonal of one micro device 640a, respectively. From the other side, one holding structures 660c connects two micro device 640a.

Figure 8B:
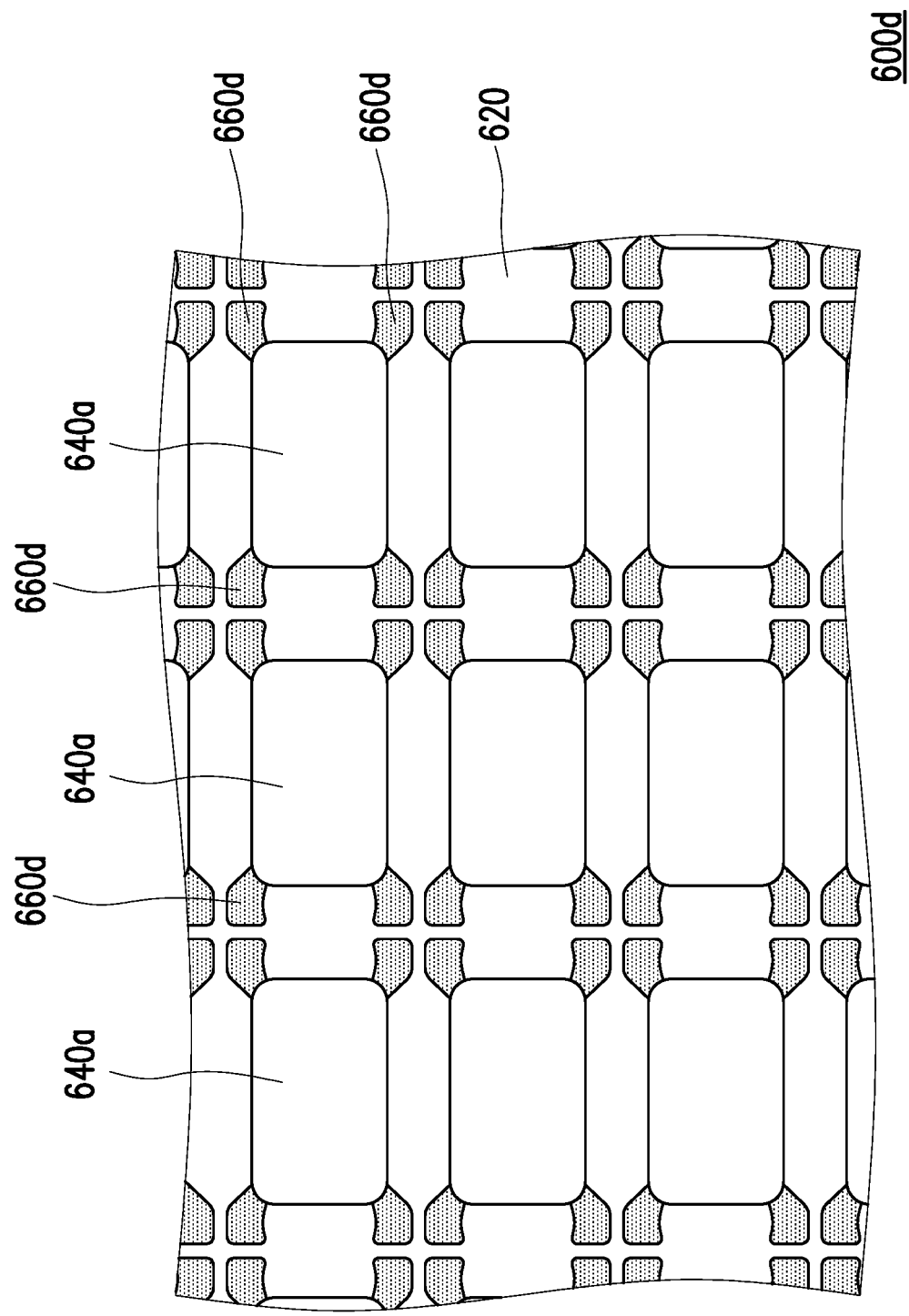
FIG. 8B is a schematic top view of a structure with micro device according to another embodiment of the invention.

FIG. 8B is a schematic top view of a structure with micro device according to another embodiment of the invention. A structure with micro device 600d of the embodiment is similar to the structure of the micro device 600a of the above embodiment, and the difference between the two is that four holding structures 660d are located at the four corners of one micro device 640a, respectively. The holding structures 660d are not connected to the adjacent holding structures 660d, that is, the holding structures 660d are independent of each other. Therefore, the holding structures 660d can have a batter fixing effect and does not affect the adjacent micro device 660a during the transfer.

FIG. 8C is a schematic three-dimensional view of a structure with micro device according to another embodiment of the invention. A structure with micro device 600e of the embodiment is similar to the structure of the micro device 600a of the above embodiment, and the difference between the two is that one holding structure 660e connects two adjacent rows of the micro devices 640a at two corners on the same side. That is, the four corner of each micro device 640a are connected to two holding structures 660e.

Figure 8D:
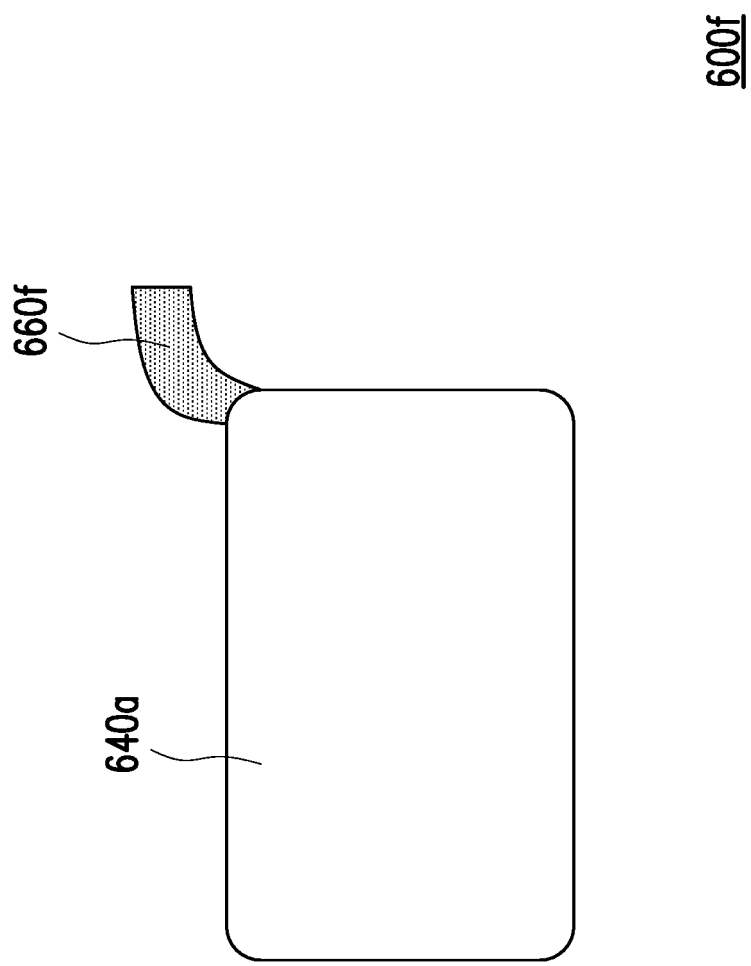
FIG. 8D is a schematic top view of a structure with micro device according to another embodiment of the invention.

FIG. 8D is a schematic top view of a structure with micro device according to another embodiment of the invention. A structure with micro device 600f of the embodiment is similar to the structure of the micro device 600a of the above embodiment, and the difference between the two is that each of the micro device 640a has only one corner connected to the holding structure 660f.

Figure 9A:
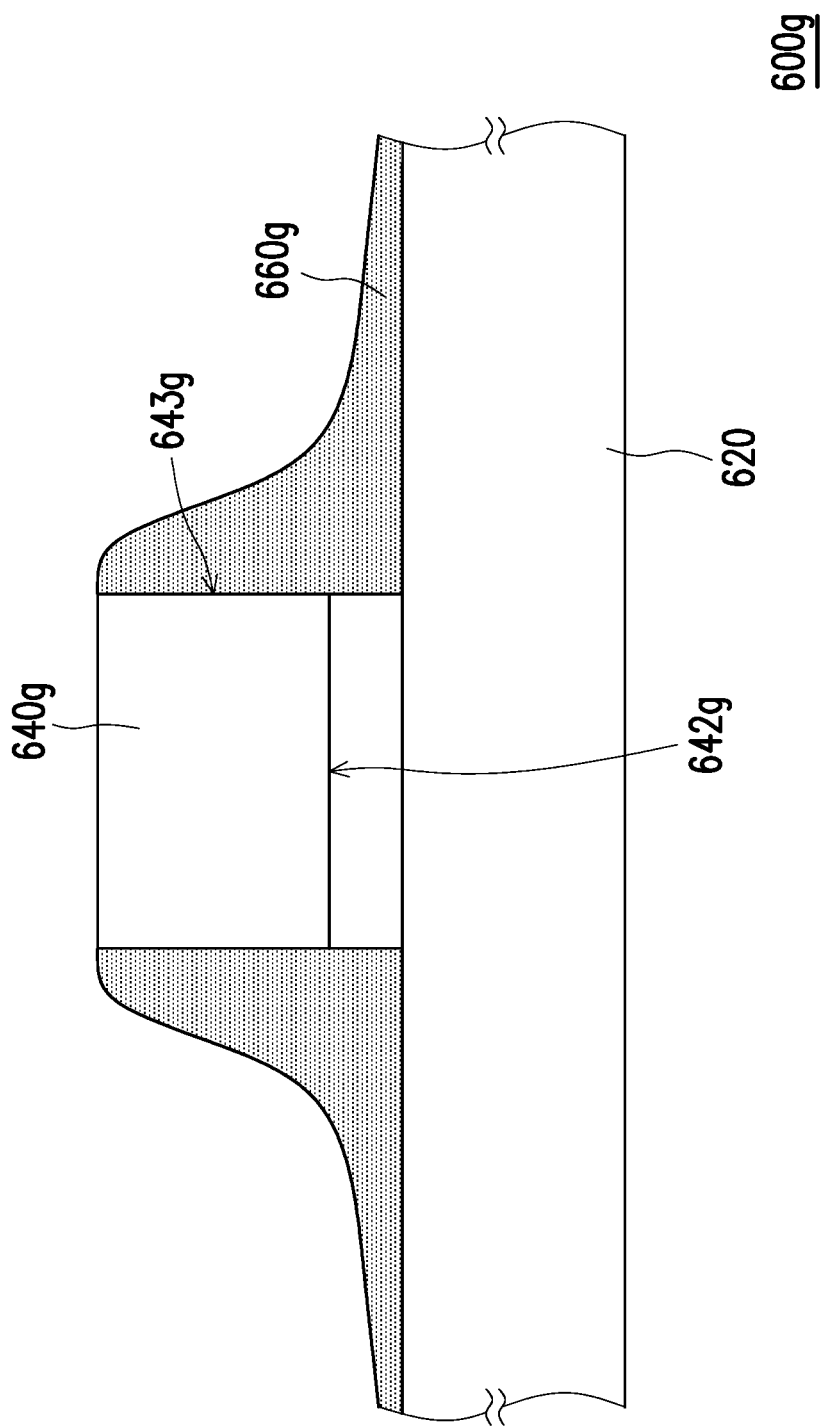
FIG. 9A is a schematic cross-sectional view of a structure with micro device according to another embodiment of the invention.

FIG. 9A is a schematic cross-sectional view of a structure with micro device according to another embodiment of the invention. A structure with micro device 600g of the embodiment is similar to the structure of the micro device 600a of the above embodiment, and the difference between the two is that the cross-sectional view of the micro device 640g is a rectangle shape, and the holding structure 660g covers the peripheral surface 643g of the micro device 640g and is aligned with the peripheral surface 643g. That is, the holding structure 660g does not extend to the bottom surface 642g of the micro device 640g.

Figure 9B:
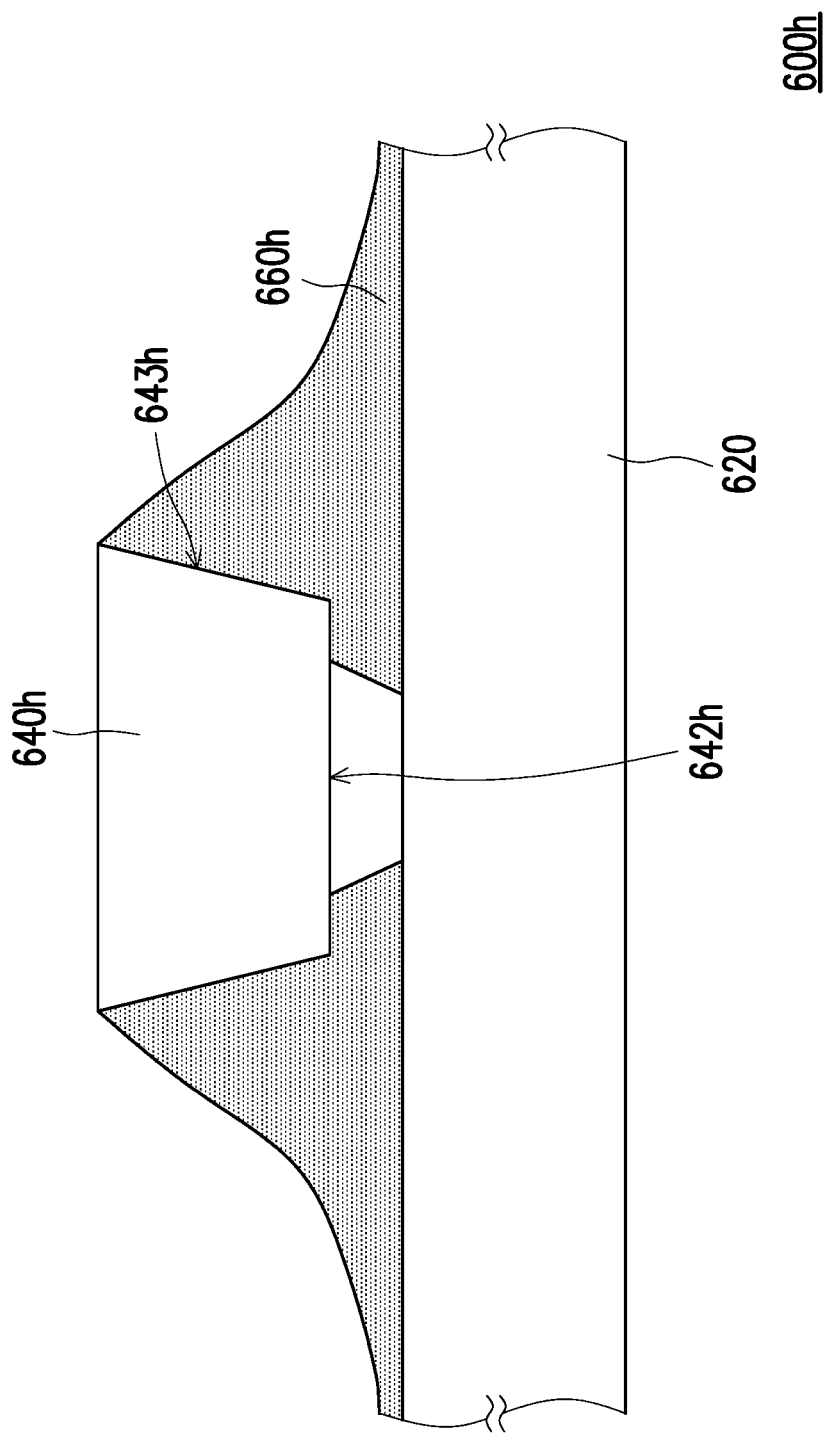
FIG. 9B is a schematic cross-sectional view of a structure with micro device according to another embodiment of the invention.

FIG. 9B is a schematic cross-sectional view of a structure with micro device according to another embodiment of the invention. A structure with micro device 600h of the embodiment is similar to the structure of the micro device 600a of the above embodiment, and the difference between the two is that the holding structure 660h extends to the bottom surface 642h of the micro device 640h. That is, the holding structure 660h covers the peripheral surface 643h and a portion of the bottom surface 642h of the micro device 640h. Preferably, a ratio of an area of the holding structure 660h occupying the bottom surface 642h to an area of the bottom surface 642h is less than or equal to 0.5. More preferably, the above ratio is 0.2. If the above ratio is too large, the holding structure 660h cannot be removed.

Figure 9C:
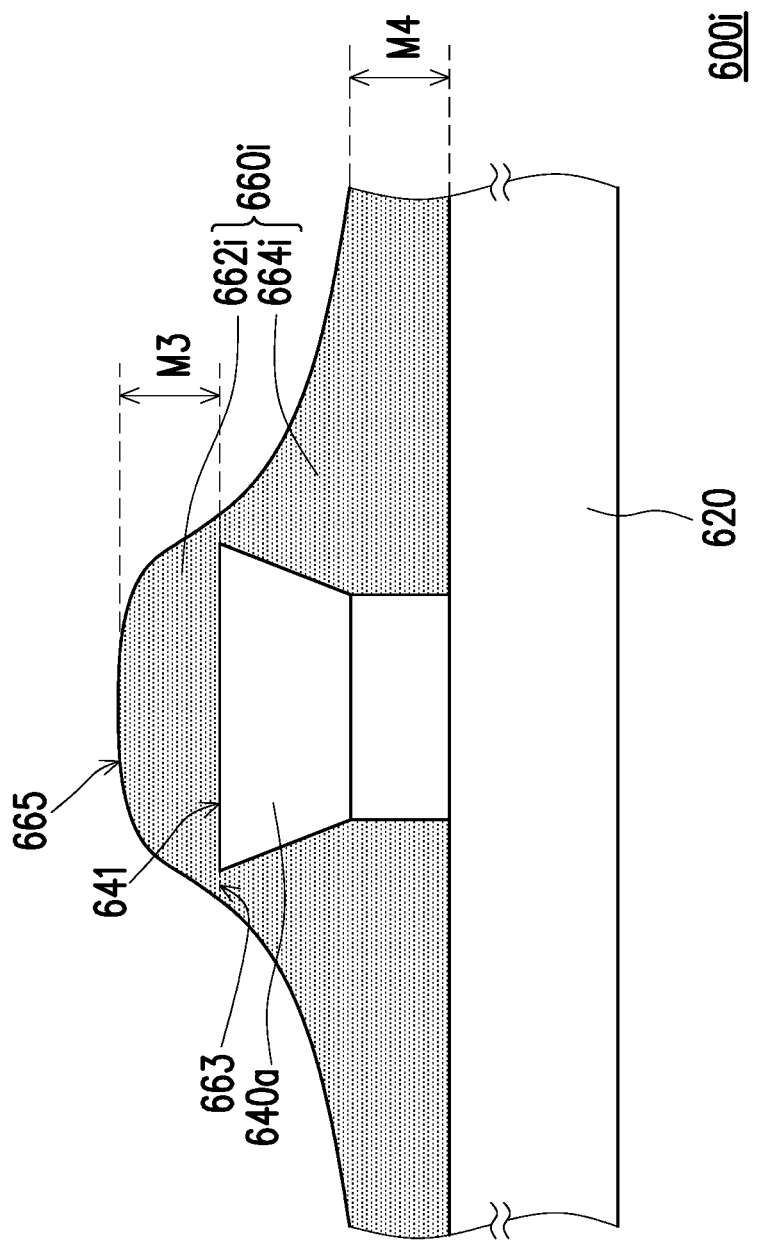
FIG. 9C is a schematic cross-sectional view of a structure with micro device according to another embodiment of the invention.

FIG. 9C is a schematic cross-sectional view of a structure with micro device according to another embodiment of the invention. A structure with micro device 600i of the embodiment is similar to the structure of the micro device 600a of the above embodiment, and the difference between the two is that the holding structure 660i includes at least one covering portion 662i and at least one connecting portion 664i. The covering portion 662i covers a portion of the top surface 641, and the connecting portion 664i connects the covering portion 662i from an edge of the top surface 641 and connects the substrate 620. Specifically, in the embodiment, the covering portion 662i includes a lower surface 663 and a non-planar surface 665, and the lower surface 663 contacts the top surface 641 of the micro device 640a. A maximum thickness M3 of the covering portion 662i is less than or equal to a minimum thickness M4 of the connecting portion 664i.

In summary, in the design of the structure with micro device of the invention, from the cross-sectional view, the thickness of the holding structure is not fixed from the boundary between the top surface and the peripheral surface of the micro device to the substrate. With such design, when the micro device is delivered and transferred between different substrates, the breaking point of the holding structure can be controlled to be close to the boundary between the top surface and peripheral surface of the micro device, thereby reducing the problem that the holding structure is not completely broken or remained, such that the yield rate of delivery and transfer of the micro LED can be improved.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:

1. A structure with micro device, comprising:
    a substrate;
    at least one micro device, disposed on the substrate and having a top surface away from the substrate, a bottom surface opposite to the top surface and a peripheral surface connecting the top surface and the bottom surface; and
    at least one holding structure, disposed on the substrate, wherein from a cross-sectional view, a thickness of the at least one holding structure is not fixed from a boundary between the top surface and the peripheral surface of the at least one micro device to the substrate, and the at least one micro device is connected to the substrate through the at least one holding structure,
    an air gap is formed between the micro device and the substrate.

2. The structure with micro device according to claim 1, wherein a horizontal distance between the at least one holding structure and the substrate in a direction parallel to the substrate is gradually increased from the boundary between the top surface and the peripheral surface of the at least one micro device to the substrate.

3. The structure with micro device according to claim 2, wherein the at least one holding structure completely exposes the top surface of the at least one micro device.

4. The structure with micro device according to claim 3, wherein an upper surface of the at least one holding structure is aligned or slightly lower than the top surface of the at least one micro device.

5. The structure with micro device according to claim 4, wherein the upper surface of the at least one holding structure is lower than the top surface of the at least one micro device, there is a gap between the upper surface and the top surface, and a ratio of a vertical distance of the gap to a thickness of the at least one micro device is less than or equal to 0.5.

6. The structure with micro device according to claim 3, wherein the at least one holding structure is disposed on the boundary between the top surface and the peripheral surface of the at least one micro device, and located on at least one corner of the peripheral surface.

7. The structure with micro device according to claim 3, wherein a ratio of a contact area of the at least one holding structure at the boundary between the top surface and the peripheral surface to an area of the peripheral surface is less than or equal to 0.05.

8. The structure with micro device according to claim 3, wherein the at least one holding structure is disposed on the peripheral surface and a portion of the bottom surface of the at least one micro device.

9. The structure with micro device according to claim 8, wherein a ratio of an area of the at least one holding structure occupying the bottom surface to an area of the bottom surface is less than or equal to 0.5.

10. The structure with micro device according to claim 3, wherein the at least one holding structure comprises a holding element and a buffering element, and a material of the holding element is different from a material of the buffering element.

11. The structure with micro device according to claim 1, wherein the at least one holding structure comprises at least one covering portion and at least one connecting portion, the covering portion covers a portion of the top surface, and the connecting portion connects the covering portion from an edge of the top surface and connects the substrate.

12. The structure with micro device according to claim 11, wherein a maximum thickness of the covering portion is less than or equal to a minimum thickness of the connecting portion.

13. The structure with micro device according to claim 11, wherein the covering portion comprises a lower surface and a non-planar surface, and the lower surface contacts the top surface of the at least one micro device.

14. The structure with micro device according to claim 1, wherein the at least one micro device further comprises an insulating layer, and the insulating layer at least covers the peripheral surface and a portion of the bottom surface, and the at least one holding structure is directly in contact with the insulating layer.

15. The structure with micro device according to claim 14, wherein the at least one holding structure only contacts the insulating layer.

16. The structure with micro device according to claim 14, wherein a material of the at least one holding structure is different from a material of the insulating layer.

17. The structure with micro device according to claim 1, wherein a minimum distance between the at least one holding structure and the substrate is less than a vertical thickness between the at least one micro device and the substrate.

18. The structure with micro device according to claim 1, wherein a ratio of a minimum thickness to a maximum thickness of the at least one holding structure on the substrate is greater than 0.2.

19. The structure with micro device according to claim 1, wherein a vertical distance between the at least one holding structure and the substrate in a normal direction of the substrate is gradually decreased from the boundary between the top surface and the peripheral surface of the at least one micro device to the substrate.

* * * * *